US011578895B2

(12) United States Patent
Mercs et al.

(10) Patent No.: US 11,578,895 B2
(45) Date of Patent: Feb. 14, 2023

(54) MULTILAYER MATERIAL

(71) Applicants: VIESSMANN FAULQUEMONT, Faulquemont (FR); CENTRE NATIONAL DE LA RECHERCHE SCIENTIFIQUE, Paris (FR); UNIVERSITÉ DE LORRAINE, Nancy (FR)

(72) Inventors: David Mercs, Faulquemont (FR); Fabien Capon, Germonville (FR); Nicolas Portha, Tritteling Redlach (FR); Alexis Boileau, Remiremont (FR)

(73) Assignees: VIESSMANN FAULQUEMONT, Faulquemont (FR); CENTRE NATIONAL DE LA RECHERCHE SCIENTIFIQUE, Paris (FR); UNIVERSITÉ DE LORRAINE, Nancy (FR)

( * ) Notice: Subject to any disclaimer, the term of this patent is extended or adjusted under 35 U.S.C. 154(b) by 667 days.

(21) Appl. No.: 16/493,037

(22) PCT Filed: Mar. 12, 2018

(86) PCT No.: PCT/FR2018/050564
§ 371 (c)(1),
(2) Date: Sep. 11, 2019

(87) PCT Pub. No.: WO2018/167411
PCT Pub. Date: Sep. 20, 2018

(65) Prior Publication Data
US 2020/0011572 A1 Jan. 9, 2020

(30) Foreign Application Priority Data
Mar. 13, 2017 (FR) ...................... 1752026

(51) Int. Cl.
*F24S 70/20* (2018.01)
*F24S 70/30* (2018.01)
*F24S 40/50* (2018.01)
*C23C 14/08* (2006.01)
*C23C 14/34* (2006.01)
*C23C 14/58* (2006.01)
*C23C 14/06* (2006.01)
*C23C 14/00* (2006.01)
*C01G 51/00* (2006.01)

(52) U.S. Cl.
CPC .............. *F24S 70/20* (2018.05); *C01G 51/70* (2013.01); *C23C 14/0036* (2013.01); *C23C 14/0676* (2013.01); *C23C 14/085* (2013.01); *C23C 14/3464* (2013.01); *C23C 14/5806* (2013.01); *F24S 40/50* (2018.05); *F24S 70/30* (2018.05); *C01P 2002/34* (2013.01)

(58) Field of Classification Search
None
See application file for complete search history.

(56) References Cited

U.S. PATENT DOCUMENTS

| | | | |
|---|---|---|---|
| 9,499,699 B1* | 11/2016 | Hall | .................. C23C 4/134 |
| 9,671,137 B2 | 6/2017 | Mercs et al. | |
| 2004/0005483 A1* | 1/2004 | Lin | .................. C23C 18/1216 |
| | | | 427/430.1 |
| 2009/0325782 A1* | 12/2009 | Venkataramani | ... C23C 18/1216 |
| | | | 219/396 |
| 2016/0033174 A1 | 2/2016 | Mercs et al. | |

FOREIGN PATENT DOCUMENTS

WO 2014/140499 A1 9/2014

OTHER PUBLICATIONS

Rougier et al., "Symposium L Chromogrnic Materials and Devices", European Materials Research Society Conference, Spring 2014, Lille, France, May 26-30, 2014, pp. 33-34 (Year: 2014).*
Rougier et al., "Symposium L Chromogenic Materials and Devices", European Materials Research Society Conference, Spring 2014, Lille, France, May 26-30, 2014, pp. 33-34, https://www.european-mrs.com/sites/default/files/pdf/symposium_1.pdf, total 36 pages; in English; cited in the ISR.
Tang et al., "The thermochromic properties of La1—xSrxMnO3 compounds", Solar Energy Materials & Solar Cells, vol. 92, No. 10, 2008, pp. 1298-1301; in English; cited in the ISR.
Fan et al., "Temperature-dependent infrared properties of Ca doped (La, Sr)MnO3 compositions with potential thermal control application", Applied Thermal Engineering, vol. 51, No. 1,2013, pp. 255-261; in English; cited in the ISR.
Li et al., "Thermal radiative properties of plasma sprayed thermochromic coating", Journal of Alloys and Compounds, vol. 583, 2014, pp. 516-522; in English; cited in the ISR.
Lim et al., "Influence of post-treatments on the contact resistance of plasma-sprayed La0.8Sr0.2MnO3 coating on SOFC metallic interconnector", Surface & Coatings Technology, vol. 200, No. 5-6, 2005, pp. 1248-1251; in English cited in the ISR.
Capon et al., "Thermochromic properties of rare earth perovskites", European Materials Research Society Conference, Spring 2014, Lille, France, May 26-30, 2014, pp. 1-46, https://www.researchgate.net/publication/283205883_Thermochromic_properties_of_rare_earth_perovskite, in English; cited in the ISR.
Laffez et al., "Electron doped (Sm1-x1Cax)MnO3 perovskite manganite as potential infrared thermochromic switch", Applied Physics Letters, vol. 89, No. 8, 2006, pp. 81909-1 to 081909-3; total 3 pages; in English; cited in the ISR.
International Search Report and Written Opinion dated May 30, 2018 issued in corresponding application No. PCT/FR2018/050564; w/ English partial translation and partial machine translation (total 34 pages).

* cited by examiner

*Primary Examiner* — David Sample
(74) *Attorney, Agent, or Firm* — Seckel IP, PLLC

(57) ABSTRACT

Thermoregulated multilayer material characterized in that it comprises at least one substrate and one thermoregulated layer, said thermoregulated multilayer material having: for λ radiation of between 0.25 and 2 μm, an absorption coefficient $\alpha m \geq 0.8$; and, for incident λ radiation of between 7.5 and 10 μm, a reflection coefficient ρm: $\rho m \geq 0.85$, when the temperature T of said multilayer material 1 is $\leq 100°$ C.; ρm between 0.3 and 0.85, when the temperature T of said multilayer material is between 0 and 400° C.

20 Claims, 4 Drawing Sheets

R(λ): evolution of the reflection coefficient as a function of the wavelength λ
S(λ): solar spectrum as a function of the wavelength λ
α: absorption coefficient of solar energy for 0.25 < λ < 2.5 μm La-Co and La-Co-O / Al : annealing at 600°C - 5x2 min
Variation of emissivity during temperature decrease (derivative calculated from fitted curves)

MULTILAYER MATERIAL

TECHNICAL FIELD OF THE INVENTION

A light ray is made up of one or several light wave(s) qualified as "electromagnetic wave". An electromagnetic wave is made up of an electric field and a magnetic field and is characterized by its time period t and its spatial period, called wave length λ.

There are in particular three types of light waves defined by the value of their wavelength λ:
- Visible waves corresponding to λ comprised between 380 and 780 nm,
- Ultraviolets corresponding to λ below 380 nm,
- Infrareds corresponding to λ above 780 nm.

Each light ray comprises one or several light beams made up of photons. Each photon has an energy $E=h\nu$, with h the Planck's constant and ν the frequency of the light wave in Hertz. The energy of a photon therefore depends on the wavelength λ.

A light beam is therefore a photon flux and is characterized by an "energy flux φ" representing the quantity of energy transported by a light beam per unit of time.

Any body at a temperature T subjected to an incident light ray with wavelength λ and energy E can absorb, transmit or reflect a portion thereof according to the following relationship:

$$E\text{ total }(\lambda,T)=Et(\lambda,T)+Ea(\lambda,T)+Er(\lambda,T)=\Gamma\cdot E\text{ total}(\lambda,T)+\alpha\cdot E\text{ total }(\lambda,T)+\rho\cdot E\text{ total }(\lambda,T).$$

The total energy "E total" of a light ray arriving on a material corresponds to the sum of the energy transmitted (Et (λ, T)), the energy absorbed (Ea (λ, T)) and the energy reflected (Er (λ, T)) by this material, at a given wavelength λ and temperature T.

When an incident light ray i.e., an energy flow φ comes into contact with a body having a temperature T, the following properties can be defined:
- The transmittance or "transmission coefficient": Γ $\Gamma=(\phi t/\phi 0)$; with φt corresponding to the energy flow passing through the material, and Φ0 corresponding to the incident energy flow contributed by the incident ray. The transmittance depends on the wavelength λ of the incident light ray, the temperature, the thickness and the composition of the material or the body, it corresponds to the energy fraction resulting from a light ray capable of passing through the material or the body.
- The absorbance or "absorption coefficient": α $\alpha=\log(1/T)=\log(\phi_0/\phi)$. This corresponds to the ratio of the absorbed energy flow to the incident energy flow. The absorbance of a material depends on the wavelength λ of the incident light ray, the temperature, the thickness and the composition of the material of said body, it corresponds to the energy fraction resulting from a light ray capable of being absorbed by said considered material.
- The reflectance or the "reflection coefficient": $\rho=(\phi r/\phi_0)$ with φr corresponding to the energy flow reflected on the surface of the material, and $\Phi_0$ corresponding to the incident energy flow contributed by the incident ray. The reflectance ρ corresponds to the capacity of a material to reflect an incident light wave at the material and can in particular be influenced by its surface state and its roughness.

The principle of conservation of the energy flow is reflected by the following equation: $\Gamma+\alpha+\rho=1$.

For a material, the following terms can also be defined:
The emissivity ε:
The emissivity ε of a material reflects its capacity to emit radiation relative to a black body under the same temperature and wavelength λ conditions.
A black body is an emissive body for which the absorbance $\alpha=1$ irrespective of the wavelength λ.
At a given equilibrium temperature and in order to preserve its thermal equilibrium, the black body re-emits all of the power that it receives. The power that it absorbs is then equal to the energy power that it emits. Kirchhoff's law specifies that for a constant temperature and for a given wavelength λ, the emissivity ε of a material at thermal equilibrium (comparing it to the black body of the same temperature) is equal to the absorbance ($\varepsilon=\alpha$).
Thus, for a given wavelength λ, the emissivity ε can be defined as follows:
$\varepsilon=1-\Gamma-\rho$, and for an opaque body: $\varepsilon=1-\rho$.
A thermochrome effect: this corresponds to the capacity of the material, as a function of its temperature T, to have a reversible variation of its optical properties, in particular absorption, transmission, reflectance or emission of an incident light ray. Reference is then made to a thermochrome material;
"T" representing the average internal temperature of the material or of the thermochrome body under consideration,
"Tc" representing the critical transition temperature of the considered thermochrome material, i.e., the temperature at which the electric and optical properties of the material change significantly, Tc being able to be defined as the maximum of the first drift of the evolution of the optical or electric signal as a function of temperature T. In other words, "Tc" corresponds to the "threshold" temperature that the material will reach and past which its intrinsic electric and optical properties change.
the optical index "n": defines the ratio between the speed of a light wave in the vacuum and the propagation speed of the wave in question in said material, "n" depends on the temperature and the nature of the environment and the wavelength λ.

Furthermore, in the field of thermal solar panels making it possible to heat a heat transfer fluid, it is also possible to define the initial performance value "η 0", i.e., the capacity of the panels to transform the incident energy from the light rays of the sun into thermal energy capable of heating a heat transfer fluid.

"η 0" is the product between the absorbance value of the considered absorbent material (generally the assembly made up of the aluminum support sheet and the fin absorbent layer), transmittance of the glass of the panel, and a factor F' accounting for the quality of the heat transfer between the absorbent material of the panel and the heat transfer fluid. Generally, the glass transmits at least 91% of the incident rays from the sun, the wavelength of which is between 250 and 2500 nm, and F'=0.94. Thus, with an absorbent material having an absorbance of the incident rays from the sun, the wavelength of which is between 250 and 2500 nm of 0.94, the initial efficiency η 0 is 0.94×0.91×0.94=0.804.

BACKGROUND OF THE INVENTION

The invention relates to a thermal material, in particular of the absorbent type, the role of which is to convert the absorbed energy into heat energy. This heat energy is capable of giving heat that is directly usable into a heat network, commonly of the hot domestic supply water type.

The invention particularly relates to a self-adapting, thermo-regulated multilayer material capable of absorbing light rays defined by a certain wavelength λ, in particular between 250 and 2500 mm corresponding to the solar emission spectrum.

The multilayer material of the invention is capable of adapting its electric and optical properties, in particular in the infrared, based on the value of its internal temperature.

Such a device will be particularly applicable in the field of solar panels, in particular thermal solar panels.

In a known manner, in order for a thermal solar panel to be effective, it must have a maximum absorption capacity for the energy from light rays, in particular solar rays, while maximally limiting the loss of energy by thermal radiation when the panel is hot.

During normal operation, the energy from solar rays is converted into heat by the solar panel. This heat is discharged via a heat transfer fluid in order to heat the water from a reservoir, for example using a heat exchanger.

As long as the heat transfer fluid circulates in the panel, the heat from the panel is discharged and its temperature remains below from 100 to 120° C.

When the water from the reservoir reaches the desired temperature, necessary to supply the heat network, the circulation of the heat transfer fluid is stopped. As a result, the energy stored by the panel is no longer discharged while said panel is still subject to the solar light rays. In this case, the temperature of the panel increases up to an equilibrium temperature, called "stagnation temperature". At the stagnation temperature, the initial efficiency n0 of the panel is nil. In other words, the "stagnation temperature" can be defined as the temperature difference at which the energy gains from light rays coming from the sun cannot offset the heat losses of the panel. This "stagnation temperature" can reach a value of between 220 and 250° C. for a sunshine of 1000 W/m². Thus, under stagnation conditions, the panel is incapable of dissipating the stored heat.

Such a high stagnation temperature has several drawbacks.

On the one hand, it causes an accelerated deterioration of the heat transfer fluid, usually guaranteed for a maximum usage temperature of 170° C., said heat transfer fluid then having to be renewed periodically. Furthermore, the high stagnation temperatures, above 140° C. for a pressure of the heat transfer fluid of about 3 bars in the panels, promote the vaporization/condensation cycles of the heat transfer fluid. These cycles are accompanied by significant pressure variations, in particular pressure variations >1 bar, which can generate leaks at the various hydraulic connections.

Furthermore, an overly high "stagnation temperature" causes a risk of deterioration of the very material making up said solar panel, as well as a loss of its absorption capacities and a deterioration of its optical properties.

One of the solutions proposed by international application WO 2014/140499 to resolve this problem of stagnation temperature of the panel consists of using a "thermochrome material" with a base of vanadium oxide $VO_2$ or a combination of vanadium oxides to contribute heat to the heat transfer fluids.

This material has a "thermochrome effect" as a function of its critical transition temperature "Tc". Indeed, for an identical absorbance capacity:

when the temperature of the vanadium oxide-based thermochrome material is below its critical transition temperature Tc, the material will have an absorbance greater than 0.75 for the rays with a wavelength between 0.4 and 2.5 μm. The material will therefore absorb and partially convert the radiation coming from the sun into heat. In parallel, the transmittance of the selective layer of vanadium oxide greater than 0.85 in the infrared makes it possible to obtain a material with a high infrared reflectance, i.e., with a low emissivity and having low thermal losses. These properties are further conditioned, owing to the support, on which the vanadium oxide selective layer rests, which is a good reflection of the infrareds, which is to say having a reflectance greater than 0.8 for the wavelengths A greater than 5 μm. Thus, the majority of the heat is transmitted to the heat transfer fluid;

when the temperature of the vanadium oxide-based thermochrome material is above its critical transition temperature Tc, the material keeps an absorbance greater than 0.75 for the rays with a wavelength between 0.4 and 2.5 μm. The material continues to absorb and partially convert the radiation coming from the sun into heat. However, the transmittance of the selective layer of vanadium oxide is reduced to values of between 0.5 and 0.2, which, for a constant absorbance of the selective layer, leads to a reduction of the reflectance of the material, that is to say to a high emissivity and high heat losses. Thus, to keep the energy balance, less heat is transmitted to the heat transfer fluid, which heats less.

In conclusion, with a $VO_2$-based thermochrome material, the infrared emissivity of the material is variable as a function of the internal temperature of said material. Thus, under stagnation conditions, when the material reaches its maximum internal temperature, the emissivity is high and the energy lost by thermal radiation increases, that is to say that the quantity of incident energy arriving toward the heat transfer fluid is decreased. As a result, the heat transfer fluid deteriorates less quickly, since it is less heated.

The drawback of the $VO_2$-based thermochrome material lies in the fact that its critical transition temperature Tc is about 68° C. This Tc cannot be significantly modified or increased without altering the electrical or optical properties of the material, to the detriment of its thermochrome properties.

In other words, in the prior art, the thermochrome effect of the material is observed for a relatively low critical transition temperature Tc. This temperature Tc of 68° C. is reached fairly quickly in the presence of an intense solar radiation (very sunny weather), which limits the efficiency of the solar panel during its operation. Indeed, when the $VO_2$-based thermochrome material, making up the solar absorber or sensor of a thermal solar panel, reaches the transition temperature Tc of 68° C., the heat transfer fluid at the exchanger of a hot domestic supply water accumulation container for example is only about 55° C. due to various heat losses at the system (couplers, pipe lengths, etc.). Thus, for a heating setpoint of the domestic supply water above 60° C. in the accumulation container and equivalent heat losses of the system, the temperature of the thermochrome material must be above 73° C. Yet at this temperature, the properties of the $VO_2$-based thermochrome material, that is to say, of the thermochrome solar absorber or sensor, are transformed, resulting in an increase of the heat losses and a lower efficiency.

Ideally, a critical temperature Tc above 80° C. is desirable for a thermal solar application without performance loss of the solar panel.

This is why it is necessary to find an adequate solution as an alternative to the solar panel of the prior art making it possible to keep, under operating conditions, a good energy efficiency of the solar panel, while decreasing, under stagnation conditions, the value of the stagnation temperature of the material.

It should be noted that the decrease of the value of the stagnation temperature of a material, usable as solar panel, is a direct consequence of an increase in the emissivity of the material.

The present invention aims to offset the drawbacks of the state of the art, by proposing a thermoregulated multilayer material comprising at least:

A support having:
  a transmission coefficient Γs substantially equal to 0, for rays with wavelength λ of between 0.25 and 25 μm;
  a reflection coefficient ρs≥0.9, for incident rays with wavelength λ of between 7.5 and 10 μm;
and also comprising at least one thermoregulated layer with a thickness of between 50 and 500 nm with a base of rare earth perovskite cobaltites or rare earth perovskite nickelates or rare earth manganites, said thermoregulated layer (2) topping one of the surfaces of said support.

More specifically, said thermoregulated multilayer material has:
  for rays with wavelength λ of between 0.25 and 2.5 μm; an absorption coefficient αm≥0.8;
  and, for incident rays with wavelength λ of between 7.5 and 10 μm; a reflection coefficient ρm:
    ≥0.85, when the temperature T of said multilayer material is ≤100° C.;
    between 0.3 and 0.85, when the temperature T of said multilayer material is between 100 and 400° C.

Furthermore, according to another feature of the invention, said perovskites have formula $ABO_3$:
  With "A" being at least one single chemical element or a group of chemical elements belonging to the rare earths group;
  With "B" being either cobalt Co, or nickel Ni, or manganese Mn, and
  With "O3" representing three oxygens.

Furthermore, according to other features of the invention:
"A" corresponds to at least one chemical element belonging to the rare earths family chosen from the following list: lanthanum La; praseodymium Pr; neodymium Nd; samarium Sm; gadolinium Gd or europium Eu;
advantageously, said at least one chemical element "A" of the perovskite with formula $ABO_3$ is partially doped with at least one chemical element "E" of atomic fraction "z" of between 0.1 and 0.6, said element "E" belonging to the alkaline-earth group chosen from the following list: strontium Sr; calcium Ca or barium Ba, such that the thermoregulated layer has formula $A_{1-z}E_zCoO_3$ or $A_{1-z}E_zNiO_3$ or $A_{1-z}E_zMnO_3$;
the element "B" of the perovskite with formula $ABO_3$ is partially doped with at least one chemical element "D" of atomic fraction "y" of between 0.1 and 0.5; said element "D" belonging to the transition metals group chosen from the following list: cobalt Co; nickel Ni; manganese Mn; iron Fe; titanium Ti; vanadium V or chromium Cr, such that the thermoregulated selective layer has formula $ACo_{1-y}D_yO_3$ or $ANi_{1-y}D_yO_3$ or $AMn_{1-y}D_yO_3$;
also advantageously, the oxygens "$O_3$" of the perovskite with formula $ABO_3$ are partially doped with nitrogen N with atomic fraction "x" of between 0.03 and 1, such that the thermoregulated layer has formula $ACoC_{3-x}N_x$ or $ANiO_{3-x}N_x$ or $AMn_{3-x}N_x$.

Preferably, the thermoregulated layer with formula $ABO_3$, comprising at least one of these elements "A", "B" or partially doped "$O_3$":
  has a thickness of between 300 and 500 nm, and
  has, for incident rays with wavelength λ of between 7.5 and 10 μm, a transmission coefficient ΓT:
    ≥0.95 for an internal temperature of said thermoregulated layer less than or equal to 100° C.;
    ≤0.6 for an internal temperature of said thermoregulated layer of between 100 and 200° C.

According to one embodiment, said support consists of a metal sheet with a base of aluminum Al or copper Cu.

According to another preferred embodiment, said thermoregulated sheet is covered with an antireflection layer.

According to another embodiment of the invention, said material comprises a barrier layer able to prevent the diffusion in solid state of chemical elements of the support toward the thermoregulated layer, said barrier layer being positioned between said support and said thermoregulated layer.

According to one preferred embodiment of the invention, said thermoregulated multilayer material of the invention has:
  for rays with wavelength λ of between 0.25 and 2.5 μm; an absorption coefficient αm≥0.94;
  and, for incident rays with wavelength λ of between 7.5 and 10 μm; a reflection coefficient ρm:
    ≥0.92, when the temperature T of said multilayer material (M) is ≥100° C.;
    ≤0.6, when the temperature of said multilayer material is ≥100° C.

The present invention also relates to a method for manufacturing a multilayer material according to the invention in which:
  A thermoregulated layer with general formula $ABO_3$ is deposited on said support by vacuum co-sputtering, in the presence of a reactive plasma of argon and oxygen or of pure argon, with "A" being at least one single chemical element or a group of chemical elements belonging to the rare earths group and "B" being a transition metal of type Ni, Mn or Co,
  The material previously obtained is annealed ex situ at temperatures of between 525 and 800° C., preferably 575 and 600° C. for a duration of between 30 seconds and 1 hour, preferably between 30 and 240 seconds.

The present invention also relates to a solar panel comprising a thermoregulated multilayer material according to the invention.

BRIEF DESCRIPTION OF THE DRAWINGS

Other features and advantages of the invention will emerge from the following detailed description of non-limiting embodiments of the invention, in reference to the appended figures, in which.

DETAILED DESCRIPTION OF PARTICULAR EMBODIMENTS

Figure 1:
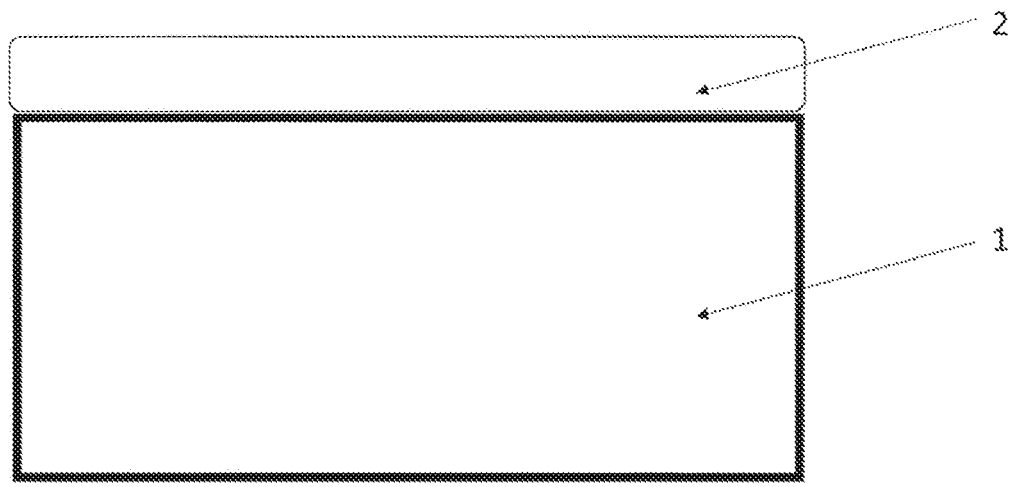
FIG. 1 schematically shows a thermoregulated multilayer material of the invention comprising the support and the thermoregulated layer.

The present invention relates to a thermoregulated multilayer material (M) as shown in FIG. 1, 5, 6 or 7.

"Thermoregulated" refers to the capacity of the material to self-regulate its internal temperature so as not to exceed 150° C., and preferably to stay between 130 and 140° C. Thus, if said thermoregulated material is used as thermal solar panel to heat a heat transfer fluid, the fact that it does not exceed 150° C. makes it possible to avoid the vaporization of the heat transfer fluid in the thermal solar panel for an internal pressure on the order of 3 bars, when it is subject to an incident light ray made up of light waves with a wavelength between 0.25 and 2.5 µm.

More specifically, the self-regulation of the internal temperature T of the material M is possible owing to the modification of its optical properties, generating or not generating a strong heat loss.

According to the invention, said thermoregulated multilayer material M comprises at least one support 1 topped by at least one thermoregulated layer 2. Optionally, said material M can also comprise, in addition, an antiglare layer 3 and/or a barrier layer 4.

According to the invention, said support 1 is made from a material having, irrespective of the internal temperature of said support:
 a transmission coefficient $\Gamma_s$ equal or substantially equal to 0, for rays with a wavelength $\lambda$ of between 0.25 and 25 µm;
 a reflection coefficient $\rho s \geq 0.9$, for incident rays with wavelength $\lambda$ of between 7.5 and 10 µm.

Said support 1 is made up of a metal material mechanically withstanding temperatures of between 50 and 600° C.

According to one embodiment, said support 1 consists of a metal sheet with a base of aluminum Al or copper Cu with a thickness of between 0.1 and 2 mm. Said support 1 has an adequate surface state, in particular a roughness, allowing it to achieve the value of the aforementioned reflection coefficient, for infrared rays.

The small thickness of the support 1 has the advantage of decreasing the manufacturing costs of said support 1 on the industrial scale as long as the mechanical strength, in particular at high temperatures, is retained.

According to another specific embodiment, the support 1 is made up of a metal sheet made up of 99.7% aluminum Al, with a thickness equal to 0.4 mm, having a mechanical tensile strength $R_M \geq 160$ MPa at ambient temperature.

Figure 3:
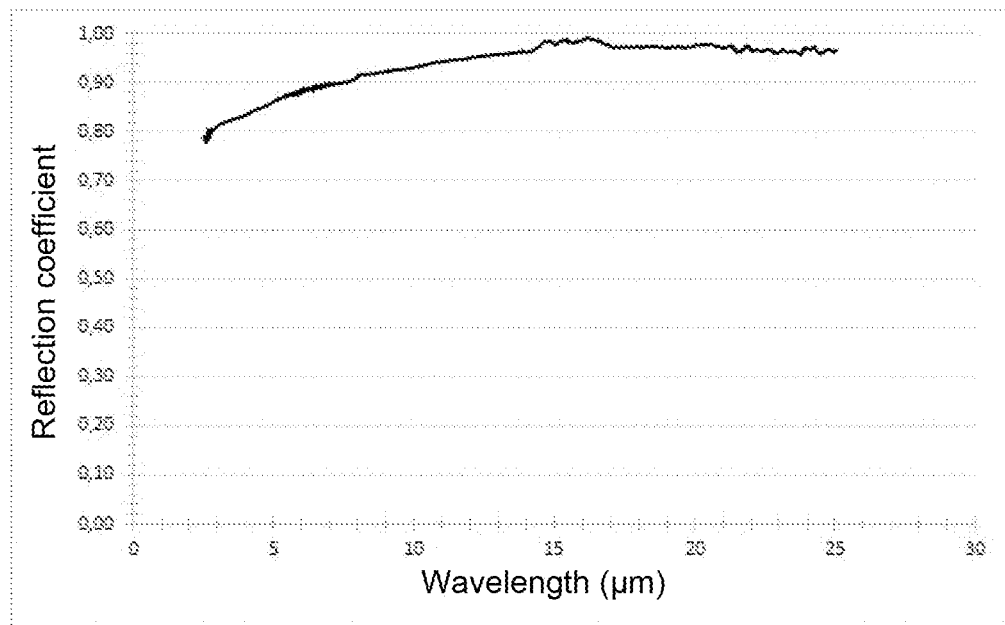
FIG. 3 graphically shows the evolution of the reflectance $\rho_s$ of a support as a function of the wavelength $\lambda$ of an incident light ray, said support being made up of a sheet of 99.7% pure aluminum; with a thickness of 0.4 mm.

As illustrated in FIG. 3, this particular support 1 advantageously has a reflection coefficient $\rho s \geq 0.9$ for incident rays with wavelength $\lambda$ between 7.5 and 10 µm, or a capacity to reflect 90% of the incident energy coming into contact with it.

According to another less expensive embodiment, said support 1 is made up of any metal material, mechanically withstanding traction and temperatures that may reach up to 600° C., and having a thickness of between 0.1 and 2 mm.

According to the invention, said support 1 is topped by a thermoregulated layer 2 that provides, in combination with the characteristics of said support 1, the optical properties of the thermoregulated multilayer material M of the invention.

In other words, the thermoregulated layer 2 tops one of the surfaces of said support 1, and thus allows an interaction between said support 1 and said layer 2 generating specific optical properties of all of the thermoregulated multilayer material M.

In all cases, to carry out the invention, it is necessary for the thermoregulated layer 2 to be deposited on a support 1 capable of reflecting an infrared radiation.

According to the invention, said thermoregulated layer 2 has a thickness of between 50 and 500 nm, preferably with a base of rare earth perovskite nickelates or rare earth manganites.

According to one specificity of the invention, the perovskites have formula $ABO_3$:
 With "A" being at least one single chemical element or a group of chemical elements belonging to the rare earths group;
 With "B" being either cobalt Co, or nickel Ni, or manganese Mn, and
 With "$O_3$" representing three oxygen atoms.

The rare earths consist of a group of 17 metals with adjacent electromagnetic and chemical properties.

Advantageously, the perovskites have, as element "A", an element corresponding to at least one chemical element belonging to the rare earths family, preferably chosen from the following list: lanthanum La; praseodymium Pr; neodymium Nd; samarium Sm; gadolinium Gd or europium Eu.

In other words, "A" can be made up of one or several chemical element(s) of the aforementioned rare earth type.

According to one favored embodiment of the invention, the element "A" consists of lanthanum La.

According to one specific embodiment of the invention, said at least one chemical element "A" of the perovskite with formula $ABO_3$ is partially doped with at least one chemical element "E" of atomic fraction z of between 0.1 and 0.6, said element "E" belonging to the alkaline-earth group chosen from the following list: strontium Sr; calcium Ca or barium Ba, such that the selective thermoregulated layer (2) has formula $A_{1-z}E_zCoO_3$ or $A_{1-z}E_zNiO_3$ or $A_{1-z}E_zMnO_3$.

According to another specific embodiment of the invention, said perovskites have, as element "B", cobalt Co, nickel Ni or manganese Mn, said element "B" being partially doped with at least one chemical element "D" of atomic fraction "y" of between 0.1 and 0.5; said element "D" belonging to the transition metals group chosen from the following list: cobalt Co; nickel Ni; manganese Mn; iron Fe; titanium Ti; vanadium V or chromium Cr, such that the thermoregulated selective layer (2) has formula $ACO_{1-y}D_yO_3$ or $AN_{1-y}D_yO_3$ or $AMn_{1-y}D_yO_3$.

According to one preferred embodiment, used as thermoregulated layer 2 will be a compound from the family of manganites with formula $AmnO_3$ doped with barium Ba. The latter has the advantage of increasing the $\varepsilon_M$ of the multilayer material M in a temperature range around 100° C.

In other words, for a temperature range between 20° C. and 100° C., the emissivity $\varepsilon_M$ of the multilayer material M of the invention will vary between 0.5 and 0.65 if the thermoregulated layer 2, covering an aluminum support 1, has a base of barium-doped manganite.

According to an additional embodiment of the invention, the perovskites with formula $ABO_3$ are partially doped at their "$O_3$" anionic site with nitrogen N with atomic fraction x of between 0.03 and 1, such that the thermoregulated selective layer (2) has formula $ACoO_{3-x}N_x$ or $ANiO_{3-x}N$, or $AMn_{3-x}N_x$.

Advantageously, the thermoregulated layer 2 with formula $ABO_3$ comprises at least one of these elements "A", "B" or partially doped "$O_3$" as mentioned above.

Thus, the different possible dopings of the thermoregulated layer 2 make it possible to modify the optical and electrical properties of the multilayer material M and to modulate its critical transition temperature Tc for its thermochrome effect.

For these specific optical properties, this material M of the invention is quite favorable for being used as solar panel in domestic or collective residences. In particular, said material M can be used as thermal solar panel intended to heat a heat transfer fluid supplying a domestic or industrial hot network.

According to one preferred embodiment of the invention, the thermoregulated multilayer material M includes a thermoregulated layer 2 with a thickness of between 300 and 500 nm with formula $ABO_3$, comprising at least one of these elements "A", "B" and "$O_3$" that may or may not be partially doped, and has, for incident rays with wavelength λ of between 7.5 and 10 μm, a transmission coefficient ΓT:

≥0.95 for an internal temperature of said thermoregulated layer (2)≤100° C.;

≤0.6 for an internal temperature of said thermoregulated layer (2) of between 100 and 200° C.

Owing to the respective optical properties of the support 1 and the thermoregulated layer 2 and the interaction between the two, the multilayer material M of the invention has advantageous specific overall optical properties that result from the combination and the superposition of the two. Indeed, the multilayer material M has, for rays with wavelength λ of between 0.25 and 2.5 μm, an absorption coefficient αm≥0.8 irrespective of the temperature of the support 1 topped by its layer 2.

Thus, the multilayer material M of the invention is capable of absorbing at least 80% of the energy coming from an incident light ray with wavelength λ of between 0.25 and 2.5 μm at said material M.

According to a specificity of the invention, said multilayer material M has, for incident rays with wavelength λ of between 7.5 and 10 μm; a reflection coefficient ρm:

≥0.85, when the temperature T of said multilayer material (M) is ≤100° C.;

between 0.3 and 0.85, when the temperature T of said multilayer material (M) is between 100 and 400° C. More specifically, said multilayer material M has, for incident rays with wavelength λ of between 7.5 and 10 μm; a reflection coefficient ρm;

≥0.85, when the temperature T of said multilayer material (M) is ≤a critical temperature Tc of between 80° C. and 120° C.;

between 0.3 and 0.85, when the temperature T of said multilayer material is between 100 and 400° C., preferably between 100 and 150° C., still more preferably between 80 and 100° C.

More specifically, the thermoregulated multilayer material M of the invention advantageously has:

for rays with wavelength λ of between 0.25 and 2.5 μm, irrespective of the temperature; an absorption coefficient $\alpha_m$≥0.94;

and, for incident rays with wavelength λ of between 7.5 and 10 μm; a reflection coefficient $\rho_m$:

≤0.92, when the temperature of said multilayer material (M) is 100° C.;

≤0.6; when the temperature of said multilayer material is ≥100° C.

In the remainder of the description, "T" will refer to the average internal temperature of the multilayer material M.

Likewise, "Tc" will refer to the critical temperature corresponding to the temperature at which the multilayer material M, more specifically the thermoregulated layer 2, modifies its optical and electrical properties.

Behavior of the multilayer material of the invention as a function of its temperature T For the multilayer material M of the invention, Tc being between 80 and 120° C., the applicant has studied the behavior of the multilayer material M of the invention and the modifications of its optical and electrical properties.

Operation if T<Tc

In this configuration, the thermoregulated layer 2 of the invention has a stable crystallographic structure generating a semi-conductive behavior.

Under these temperature conditions, for incident rays with wavelength λ of between 7.5 and 10 μm:

the support 1 has a strong reflection power ρs≥0.9; and a transmission coefficient Γs, substantially equal to 0, close to 0 or equal to 0, which makes it opaque;

the thermoregulated layer 2 has a semi-conductive behavior, resulting in a transmittance variance $\Gamma_T$≥0.8, therefore has a high transparency, as a result of which the multilayer material M has, under these conditions, an emissivity εm≤0.15.

As a result, when T<Tc, the multilayer material M will only emit 15% of the possible energy at this temperature. In other words, for incident rays with wavelengths λ of between 0.25 and 2.5 μm, when T<Tc, the heat losses by infrared emission limited to 15% allow an optimal operating efficiency of a thermal solar panel, equipped with the material M, to heat a heat transfer fluid, the latter for example supplying domestic supply water in a domestic facility network.

Operation if T>Tc

In this configuration, the thermoregulated layer 2 of the invention has a stable crystallographic structure generating a semimetallic or metallic behavior.

Under these temperature conditions, for incident rays with wavelength λ of between 7.5 and 10 μm:

the support 1 has a strong reflection power, that is to say a reflection coefficient ρs≥0.9; and a transmission coefficient Γs, substantially equal to 0, close to 0 or equal to 0, which makes it opaque, the thermoregulated layer 2 has a transmission coefficient $\Gamma_T$<0.9, ideally <0.6;

as a result, the multilayer material M, having, for an infrared wavelength λ of between 7.5 and 10 μm, a reflection coefficient $\rho_M$ of between 0.85 and 0.3, ideally between 0.6 and 0.3; and will have an emissivity $\varepsilon m$ of between 0.15 and 0.7, ideally between 0.4 and 0.7.

As a result, when T>Tc, the multilayer material M will emit between 15% and 70%, ideally between 40% and 70% of the possible energy at the temperature T.

In other words, for incident rays with wavelength $\lambda$ of between 0.25 and 2.5 μm, when T>Tc, the heat losses by infrared emission are greater than 15%, and ideally greater than 40%.

Thus, in the case where the material M of the invention equips a thermal solar panel heating a heat transfer fluid supplying a heat network, under these conditions where T>Tc, the energy transmitted from the panel to the heat transfer fluid is reduced and the stagnation temperature of the panel is decreased.

Thus, the material of the invention, as a function of the value of its temperature T relative to its temperature Tc, has infrared emission properties that change. The infrared emission modification influences and controls the level of the heat losses of said material M and makes it a favored candidate for use as thermal solar panel intended to heat a heat transfer fluid supplying a heat network.

According to experimental results, a solar panel made with the multilayer material M according to the invention subjected to rays from the sun with energy equal to 1000 W/m$^2$:

shows an initial operating efficiency $\eta 0 > 80\%$, makes it possible to reduce the stagnation temperature by a value equivalent to the infrared emissivity variation $\Delta\varepsilon$ (expressed in percent) observed when the temperature of the material M increases from a value T<Tc to a value $T_1$>Tc.

Thus, for an infrared emissivity variation $\Delta\varepsilon$ of 5% to 50%, for example, the stagnation temperature of a solar panel made with the multilayer material M of the invention will be decreased by about 45% relative to a traditional thermal solar panel having the same initial efficiency $\eta 0$ and having an infrared emissivity $\varepsilon m$ equivalent to that of the material M at T<Tc (0.05 in this example).

Under these conditions, if the stagnation temperature of the traditional thermal solar panel or sensor is 190° C., the stagnation temperature of a solar panel made with the multilayer material M of the invention will be only 145° C.

Thus, owing to the invention, a solar panel using the multilayer material M will last over time, will deteriorate much more slowly than the panels of the prior art, since the stagnation temperature is lower, and will make it possible to protect the entire system and thermal facility.

In addition, the decreased stagnation temperature of the solar panel will be an economic gain both in terms of renewal of the heat transfer fluid, the temperature of which will no longer exceed the limit value of 170° C. (fluid guaranteed for life), and in terms of the need for specific facilities withstanding temperatures above 150° C.

Thus, the present invention also relates to a solar panel comprising a thermoregulated multilayer material M according to the invention.

Embodiment Variant and Improvement

Figure 5:
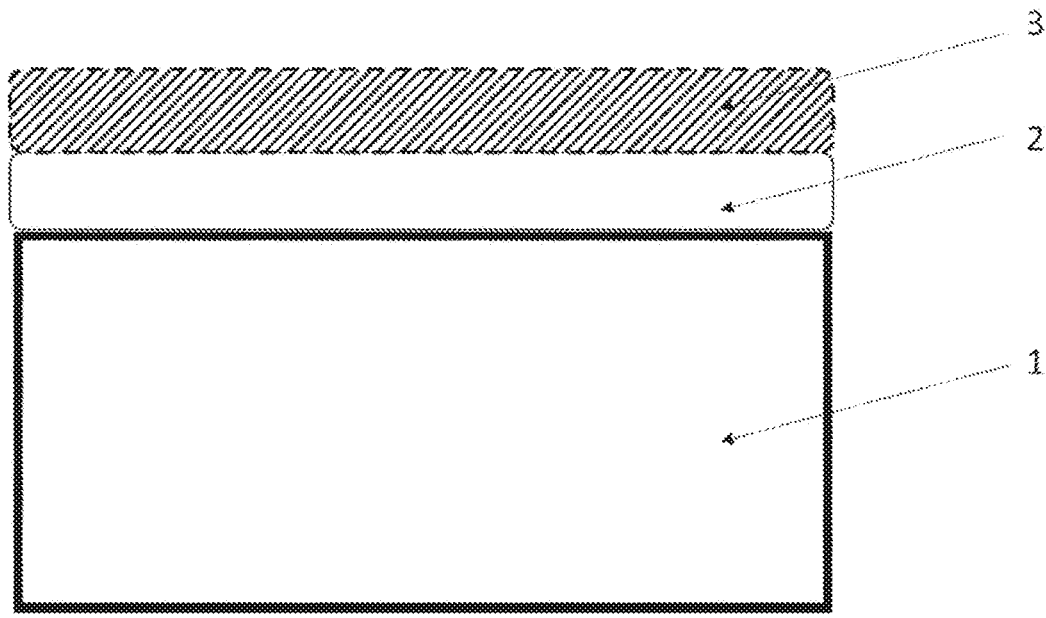
FIG. 5 schematically shows the thermoregulated multilayer material of the invention according to one specific embodiment comprising an additional antiglare layer.
Figure 6:
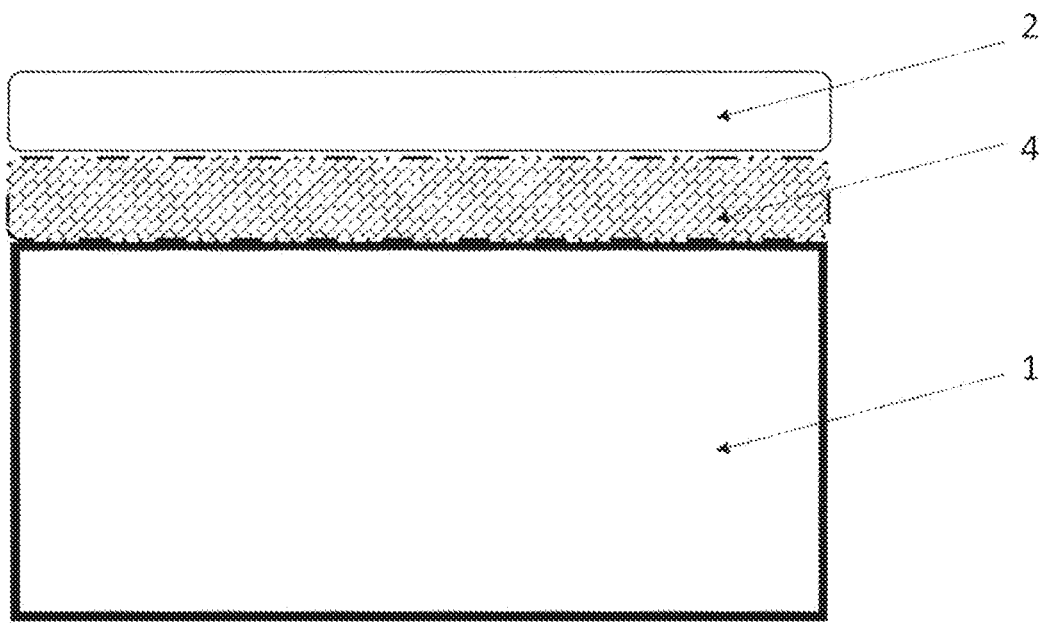
FIG. 6 schematically shows the thermoregulated multilayer material of the invention according to one specific embodiment comprising an additional antiglare layer.
Figure 7:
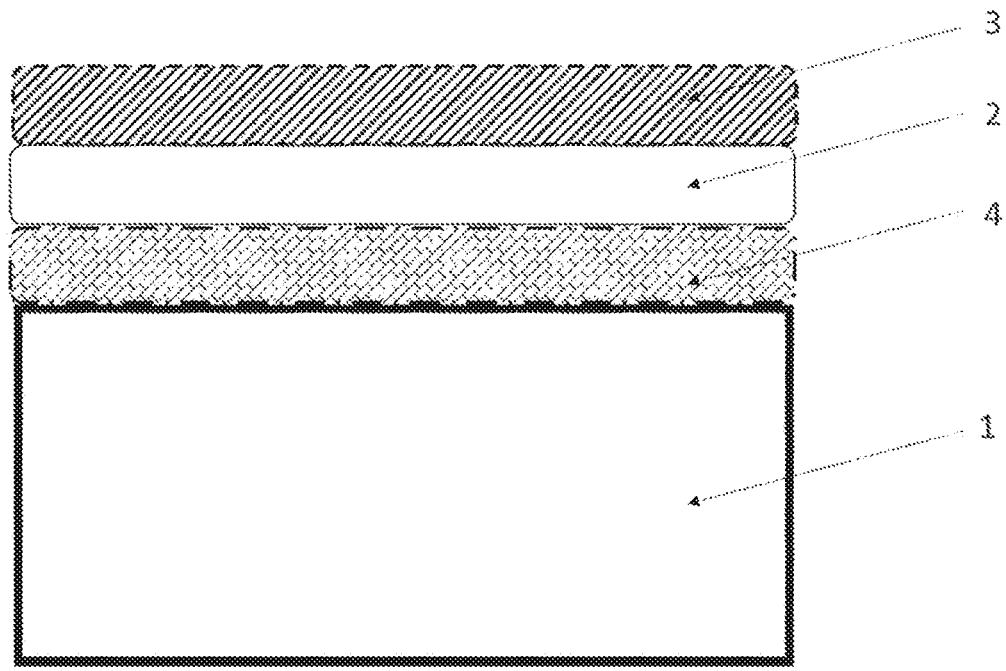
FIG. 7 schematically shows the thermoregulated multilayer material of the invention according to an additional embodiment of the invention comprising both an antiglare layer and a barrier layer.

In addition to possible dopings of the thermoregulated layer 2, the optical properties of the multilayer material M can also be modified and improved, in particular by adding an antiglare layer 3 and/or a barrier layer 4 as shown in FIGS. 5 to 7.

As shown in FIG. 5, the antiglare layer 3 is affixed directly over the thermoregulated layer 2; it makes it possible to protect the latter in addition to providing its antiglare effect.

According to the invention, said antiglare layer 3, which covers said thermoregulated layer 2, can assume the form $SiO_2$, $Si_3N_4$, $Al_2O_3$ or AlN or $TiO_2$, or a combination of these different materials, for example $TiO_2/SiO_2$.

According to one specific embodiment, in order to increase the absorption coefficient $\alpha m$ of the multilayer material M at values >0.9, for rays with a wavelength $\lambda$ of between 0.25 and 2.5 μm, said antiglare layer 3 advantageously has an optical index n<2.8 and a thickness of between 50 and 150 nm.

In general, it is necessary for the optical index n of the antiglare layer 3 to be lower than the optical index n of the thermoregulated layer 2.

Advantageously, the optical index n of the thermoregulated layer 2 is equal to the square root of the optical index n of the antiglare layer 3.

The maximum intensity of the light rays from the sun being for wavelengths $\lambda$ of between 550 and 600 mm; in order to obtain the maximum antiglare effect 3, it has been observed that the thickness "e" in nm of the antiglare layer 3 must respect the following relationship:

$$E_{nm} = (\lambda/(4 \cdot n)) = (550 \text{ to } 600/(4 \cdot n)).$$

For example, for a multilayer material M, comprising:
a thermoregulated layer 2 of $LaCoCO_3$ or $LaCoO_{3-x}N_x$;
an antiglare layer 3 with a base of $SiO_2$ with thickness "e" equal to 90 nm, with optical index "n" of between 1.48 and 1.5; the absorption coefficient $\alpha m$ of the multilayer material M will be >0.94, for rays with wavelength $\lambda$ between 0.25 and 2.5 μm.

In this example, the presence of the antiglare layer 3 has made it possible to increase the absorption coefficient $\alpha m$ by 0.04% relative to the same multilayer material M devoid of said layer 3.

Advantageously, as shown in FIG. 6, the multilayer material M can also comprise a barrier layer 4 located between the support 1 and the thermoregulated layer 2.

Said barrier layer 4 preferably has a thickness of between 10 and 100 nm, as well as a compact microstructure without porosity to perform its diffusion barrier role.

Said barrier layer 4 can be made up of an oxide, nitride or oxynitride of metals such as chromium Cr, titanium Ti, vanadium V, niobium Nb, aluminum Al, silicon Si or zirconium Zr.

The role of the barrier layer 4 is to avoid a solid-state diffusion of chemical elements from the support 1 toward the thermoregulated layer 2, during the method for manufacturing the multilayer material M of the invention, this diffusion being able to harm the optical properties of said material M.

More specifically, the barrier layer 4 makes it possible to avoid this diffusion during the high temperature rapid crystallization annealing, for example at temperatures ≥550° C.

Method for Manufacturing the Multilayer Material M

The multilayer material M of the invention can be manufactured by performing the following steps:

A thermoregulated layer 2 with general formula $ABO_3$ is deposited on said support (1) by vacuum co-sputtering, in the presence of a plasma of argon and oxygen, with "A" being at least one single chemical element or a group of chemical elements belonging to the rare earths group and B being a transition metal of type Ni, Mn or Co, The material previously obtained is annealed ex situ at temperatures of between 525 and 800° C., preferably 575 and 600° C. for a duration of between 30 seconds and 1 hour, preferably between 30 and 240 seconds.

The ratio of the powers applied to the targets "A" and the cobalt Co or nickel Ni, or manganese Mn, defines the chemical composition of said thermoregulated layer 2.

Likewise, the ratio of the argon and oxygen flow rates defines the oxidation rate of the thermoregulated layer 2.

Advantageously, an argon flow rate in excess of that of the oxygen with a ratio of 3 to 1 is favored during the deposition act in order to have a thermoregulated layer 2 with a stable oxide; that is to say, a perfectly oxidized state.

In this manufacturing method, the morphology, the density and the structure of the thermoregulated layer 2 are determined by the working pressure in Pa. The working pressure in Pa is defined by the flow rates of argon and oxygen introduced, as well as by the pumping speed of the system.

According to the invention, in order to obtain a thermoregulated layer 2 with a compact morphology, i.e., without a columnar morphology and having the optical properties of the invention, the working pressure is preferably between 0.1 and 0.5 Pa and the distance separating the targets from the substrate/support is between 5 and 10 cm.

According to the first step for co-sputtering at ambient temperature, the thermoregulated layer 2 is amorphous and does not have a thermochrome effect.

In order to obtain an at least partially crystallized structure of the perovskite type and the acquisition of the thermochrome properties of the multilayer material M of the invention, the support 1 can be kept in situ at a temperature of between 525 and 800° C., or the multilayer material M can be annealed ex situ a posteriori between 525 and 800° C., as previously described.

According to another embodiment, the thermoregulated layer 2 can also be formed in two successive steps, namely:
 a) The different components of the thermoregulated layer 2 are deposited under vacuum by co-sputtering in the presence of argon only,
 b) Annealing is done at a temperature >500° C. and at atmospheric pressure under air.

In this embodiment of oxidation/crystallization at atmospheric pressure, the oxygen naturally present in the air, with a partially homogeneous pressure, diffuses in solid state in the thermoregulated layer 2 during crystallization and thus forms the desired perovskite structure of the multilayer material M.

This second embodiment is advantageous on the industrial scale because time savings are achieved. Indeed, in the absence of oxygen, the deposition speed of the components of the thermoregulated layer 2 is divided by five.

Thus, the multilayer material M of the invention with a base of perovskites has the advantage of having a critical transition temperature Tc on the order of 100° C., which is higher than the 68-80° C. of the prior art. The thermochrome effect is achieved at a higher temperature.

Furthermore, this transition temperature Tc greater than or equal to 100° C. makes it possible to avoid errors in interpreting the efficiency curve of a solar panel made up of said material M according to the invention.

Indeed, the efficiency of a solar panel is determined by a normalization test in use in the European Union. This normalization test consists of measuring the efficiency of a solar panel by drawing the efficiency curve as a function of the average internal temperature of the panel, when the temperature of the input heat transfer fluid "T° in" is imposed and the temperature of said heated fluid "T° out" is measured at the output of said panel, for the exposure of said panel to a constant energy radiation. In this normalization test, a measurement point at 75° C. is used.

In the prior art, the thermochrome effect occurs around 60° C., but over a temperature range of from 55 to 80° C. This is problematic if an average reference temperature of the fluid of 50° C. is used to calculate the efficiency. Indeed, the value of Tc being close to 50° C. average for the fluid, at this temperature of 60° C., the panel has already slightly begun to transform and has started its thermochrome effect, resulting in an interpretation error of the efficiency curve. Thus, with the multilayer material of the prior art, having a selective layer of $VO_2$ having a critical transition temperature Tc of 68° C., a measurement point at 75° C. penalizes and falsifies the results of the normalization test.

On the contrary, with a solar panel made up of a multilayer material of the invention, the Tc being high and having a value far away from the 50° C. of the fluid, there is no longer any possible error in the interpretation of the efficiency curve, even using a measurement point at 75° C.

The examples below make it possible to illustrate the present invention and provide specific embodiments of the multilayer material M of the invention.

Example 1

By carrying out the inventive method, a multilayer material M is manufactured, in a laboratory enclosure, the thermoregulated layer 2 of which has a base of lanthanum cobaltite with formula $LaCoO_3$.

To make this material M, used as support 1 is a sheet of aluminum with a thickness of 0.4 mm on which the components of the thermoregulated layer 2 are co-sputtered.

Table 1 below provides the deposition parameters used for the synthesis of the thermoregulated layer 2 by vacuum co-sputtering.

TABLE 1

| Deposition parameter | Value |
| --- | --- |
| Working pressure (Pa) | 0.5 |
| Flow rate of argon ($Ncm^3 \cdot min^{-1}$) | 21 |
| Flow rate of oxygen ($Ncm^3 \cdot min^{-1}$) | 7 |
| Target power density La ($W \cdot cm^{-2}$) | 5.4 to 5.5 |
| Target power density Co ($W \cdot cm^{-2}$) | 2.5 to 2.6 |
| La Target - substrate distance (mm) | 55 |
| La target - Co substrate distance (mm) | 70 |

In table 1 above, the term "substrate" defines the material that will be used as support. Advantageously, the substrate consists of aluminum, used to form the support 1 for the thermochrome layer 2.

After vacuum deposition, a rapid annealing of between 525° C. and 800° C. from 30 seconds to 1 hour makes it possible to crystallize the thermoregulated layer 2 of $LaCoO_3$ so that it acquires its thermochrome effect.

The rapid annealing temperature is in this case 140° C. higher than the melting temperature of the aluminum support 1, thus the annealing duration of 30 seconds has the advantage of preserving the integrity of the support 1.

Figure 2:
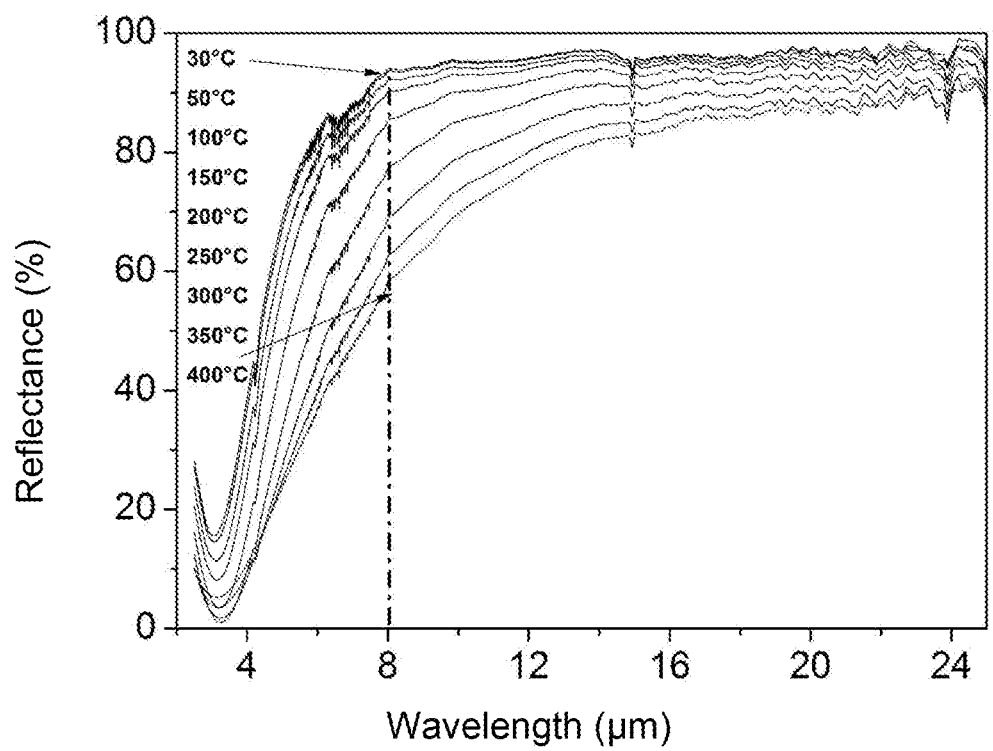
FIG. 2 graphically shows the evolution of the reflectance $\rho_M$ of a thermoregulated multilayer material, having an aluminum support and a thermoregulated layer with form $LaCoO_3$, as a function of the wavelength λ of an incident light ray arriving on said material having a variable temperature.

FIG. 2 shows, for the multilayer material M of this example 1, a variation of the reflection coefficient $\rho_m$ of said material M as a function of:
 its internal temperature varying between 30 and 400° C., and
 the wavelength λ of the incident radiation arriving on said material M.

FIG. 2 shows the thermochrome effect of the material M, which is visible for wavelengths λ of between 7.5 and 10 μm and internal temperatures of said material M of LaCoO$_3$ of between 30 and 400° C.

Thus, for an infrared incident ray with a wavelength λ of 7.5 μm, the reflection coefficient ρm evolves from 0.92 to 0.52 when the temperature of said material M increases from 30 to 400° C. This consists of the thermochrome effect and also corresponds to an increase in the emissivity ε at 7.5 μm from 0.08 to 0.48 for a temperature of said material M that increases from 30 to 400° C.

Said material M with a base of LaCoO$_3$ has all of the adequate characteristics and optical properties to serve as base material for a solar panel supplying energy, in particular of the thermal type, to a household distribution network.

Example 2

By carrying out the inventive method, a multilayer material M is manufactured, in a laboratory enclosure, the thermoregulated layer 2 of which has a base of lanthanum cobaltite doped with nitrogen with formula LaCoO$_{2.94}$N$_{0.06}$.

To make the multilayer material M of example 2, used as support 1 is a sheet of 99.7% pure aluminum, with a thickness of 0.4 mm, having a reflectance coefficient ≥0.9.

FIG. 3 shows the evolution of the reflection coefficient ρ$_s$ of said support 1 as a function of the wavelength λ of an incident ray. One can see that with said support 1, for incident rays with a wavelength λ of between 7.5 and 10 μm, the reflection coefficient ρ$_s$ of the support 1 is >0.9; it therefore has a high capacity to reflect the energy of the incident rays.

For the doping of the nitrogen of the thermoregulated layer 2, the nitrogen is added into the argon oxygen plasma and will define the nitrogen atom fraction x in the thermoregulated layer 2. In this example, the added nitrogen represents between 1 and 33% of the argon-oxygen plasma and will therefore define an atomic fraction x of between 0.03 and 1.

Table 2 below provides the deposition parameters used for the synthesis of the thermoregulated layer 2, with a thickness of 320 nm, by vacuum co-sputtering.

TABLE 2

| Deposition parameter | Value |
| --- | --- |
| Working pressure (Pa) | 0.5 |
| Flow rate of argon (Ncm$^3$ · min$^{-1}$) | 21 |
| Flow rate of oxygen (Ncm$^3$ · min$^{-1}$) | 6 |
| Flow rate of nitrogen (Ncm$^3$ · min$^{-1}$) | 1 |
| Target power density La (W · cm$^{-2}$) | 5.4 to 5.5 |
| Target power density Co (W · cm$^{-2}$) | 1.8 to 1.9 |
| Target - La substrate distance (mm) | 50 |
| Target - Co substrate distance (mm) | 70 |

After vacuum deposition, a rapid annealing of less than or equal to 1 hour makes it possible to crystallize the thermoregulated layer 2 of LaCoO$_{2.94}$N$_{0.06}$ so that the multilayer material M acquires a thermochrome effect associated with an increase in the emissivity when the temperature increases.

Figure 4:
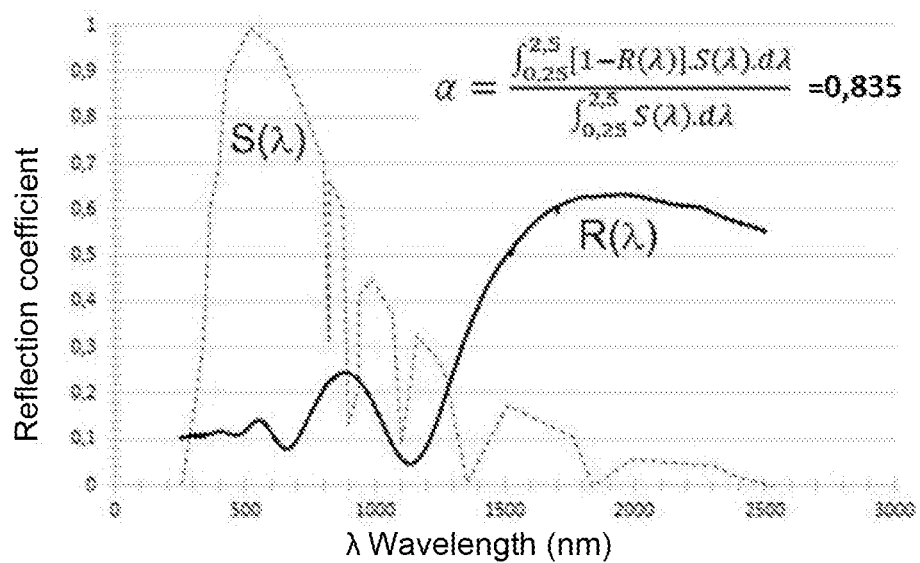
FIG. 4 graphically shows the evolution of the reflectance $\rho_M$ of a thermoregulated multilayer material of the invention according to another embodiment as a function of the wavelength $\lambda$ of an incident light ray.

The multilayer material M of example 2 with a base of a thermoregulated layer 2 of LaCoO$_{2.94}$N$_{0.06}$ advantageously has the following optical properties:
For light rays with a wavelength of between 0.2 and 2.5 μm, as shown in FIG. 4, an absorption coefficient α$_m$ of 0.835,
For rays with wavelengths of between 7.5 and 14 μm:
for a temperature of said material M<at 100° C., an average emissivity ε of 0.055
for a temperature of said material M>at 100° C., an average emissivity ε of 0.42.

Thus, the doping with nitrogen of the material manufactured in example 2 makes it possible to reduce the value of the temperature Tc to a value close to 100° C., which makes this material optimal for an application as thermal solar panel for household use.

Said material M with a base of LaCoO$_{2.94}$N$_{0.06}$ has all of the adequate characteristics and the optical properties to serve as base material for a solar panel usable in a household thermal energy network.

Under these conditions, a thermal solar panel equipped with said multilayer material of the invention has many advantages relative to the existing solutions. Indeed, the critical temperature Tc has been increased, relative to the prior art, and goes from 68° C. to 100° C. In other words, the thermochrome effect occurs at a higher critical temperature Tc than in the prior art.

Furthermore, the stagnation temperature is also reduced by a value that corresponds to 0.7 times to 1 time the observed emissivity variation Δε.

Example 3

The optical characteristics of the multilayer material M are a function of its manufacturing method and the conditions of its development, but also the thickness of the thermoregulated layer 2.

Figure 8:
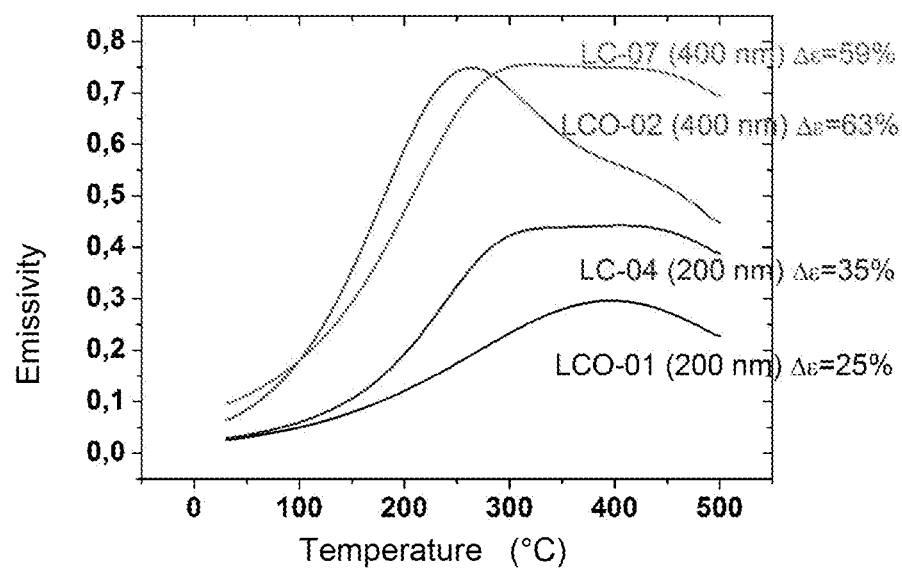
FIG. 8 graphically shows the evolution of the emissivity of a multilayer material of the invention subjected to a light ray with wavelength $\lambda$ between 7.5 and 14 µm, as a function of its internal temperature T° C., the chemical nature and the thickness (200 or 400 nm) of the thermoregulated layer of said material.

FIG. 8 shows the evolution of the emissivity ε of a multilayer material M of the invention as a function of its internal temperature T in ° C. for an incident radiation with wavelength λ between 7.5 and 14 μm.

The support 1 consists of a sheet of aluminum with thickness 0.4 mm.

Thermoregulated layers 2 with different thickness and different natures, developed with a vacuum deposition under different conditions described below followed by annealing under air at 600° C. for 10 min, were manufactured. Then their respective emissivities ε were measured.

More specifically, the emissivity is obtained by deriving the thermal camera curve, that is to say the infrared temperature as a function of the actual temperature in a wavelength range λ of between 7.5 and 14 μm.

As indicated in FIG. 8, the measurements have been done for multilayer materials having the following thermoregulated layers:
LC (400 nm) shows a multilayer material having a thermoregulated layer 2 of lanthanum cobaltite deposited under vacuum with an argon plasma without oxygen, having a thickness of 400 nm;
LCO (400 nm) shows a multilayer material having a thermoregulated layer 2 of oxidized lanthanum cobaltite deposited under vacuum with an argon plasma and oxygen, having a thickness of 400 nm;
LC (200 nm) shows a multilayer material having a thermoregulated layer 2 of lanthanum cobaltite deposited under vacuum with an argon plasma without oxygen, having a thickness of 200 nm;
LCO (200 nm) shows a multilayer material having a thermoregulated layer 2 of oxidized lanthanum cobaltite deposited under vacuum with an argon plasma and oxygen, having a thickness of 200 nm.

Vacuum deposition condition with an argon plasma without oxygen at ambient temperature:
Working pressure: 0.5 Pa
Gas flow rates 30 cm$^3$/min of Ar
Targets La: Pinacle3 generator (5.5 cm) 73 W
Target Co: generator MDX500 (7 cm) 57 W
Deposition speed: 1800 nm/h Vacuum deposition condition with an argon and oxygen plasma at ambient temperature:
Working pressure: 0.5 Pa
Gas flow rates 7 cm$^3$/min of $O_2$ and 30 cm$^3$/min of Ar
Targets La: Pinacle3 (5.5 cm) 110 W
Target Co: MDX500 (7 cm) 52 W
Deposition speed: 200 nm/h FIG. 8 shows that the emissivity ε depends on the thickness of the thermoregulated layer 2. In the case of the experiment of FIG. 8, if one doubles the thickness of the thermoregulated layer 2, going from 200 to 400 nm, then one practically doubles the maximum value of the emissivity ε.

Likewise, the conditions for vacuum deposition with argon plasma with or without oxygen will modify the value of the emissivity variation Δε as a function of the temperature. If the thermostatic layer 2 has a thickness of 200 nm, the variation of the emissivity Δε is higher for a vacuum deposition with an argon plasma than for a deposition with an argon/oxygen reactive plasma. If one doubles the thickness of the thermoregulated layer 2 to 400 nm, the variation in the emissivity is increased, but it is similar if one modifies the atmosphere of the deposition: it is 59% for a vacuum deposition with argon plasma and 63% for a deposition with an argon oxygen plasma.

It should be noted that a variation in emissivity Δε for a material, comprising a thermoregulated layer on an appropriate support of the invention, causes a decrease in the stagnation temperature of said multilayer material.

The emissivity variation Δε of a material depends both on the optical interface or existing interaction between said support and said thermoregulated layer, as well as the nature and the thickness of the support, the nature and the thickness of the thermoregulated layer.

Indeed, for a same support, the nature and the thickness of the thermoregulated layer will modify the interaction between the support and said thermoregulated layer, as well as the general optical properties of the multilayer material.

The future of the light rays, and as a result, the optical properties, will depend on the optical interface that separates the support and the thermoregulated layer. The interaction between these two uniform mediums is a function of and results from the chemical composition that determines the optical index.

As a result, the interaction between a support and a thermoregulated layer is specific to each thermoregulated layer, and optical properties, as well as an emissivity variation Δε, that are specific to the multilayer material result from this interaction.

Indeed, all of the thermochrome or thermoregulated layers do not interact in the same way with a same support and therefore do not make it possible to obtain a substantial emissivity variation Δε, preferably at least greater than 40%, to significantly decrease the stagnation temperature of the multilayer material.

In other words, for equivalent optical properties between two thermoregulated layers of identical thickness that are deposited on an identical support, the emissivity variation Δε that results from each of the obtained multilayer materials will be different and a function of the specific interaction between the support and its thermoregulated layer.

This is why, surprisingly, the inventors have shown that a thermoregulated layer with a base of perovskite with a specific thickness between 50 and 500 nm according to the invention with a support according to the invention has an interaction and physicochemical properties that are greatly improved relative to the traditional multilayer material.

As a result, this improved interaction makes it possible to increase the emissivity variation Δε of the multilayer material of the invention so that it exceeds 40% and the stagnation temperature is decreased in the expected temperature range.

It has advantageously been observed with the material of the invention that the decrease in value of the stagnation temperature is equivalent to the percentage of the emissivity variation value Δε.

For example, a Δε of 40% causes a decrease of 40° C. of the stagnation temperature of the sensor.

Thus, relative to the prior art describing a selective layer of $VO_2$, the particular choice of a thermochrome layer with a base of perovskite and a specific thickness of between 50 and 500 nm has several advantages:

- The interaction with the support indeed leads to an increase in the emissivity when the temperature increases;
- The emissivity variation Δε is increased; it is between 35% and 70% for an intrinsic perovskite without doping, unlike a material with $VO_2$ where the emissivity variation does not exceed 25% without doping with aluminum;
- the stagnation temperature of the material is decreased significantly by a value of at least 35° C.-40° C. as a result of the emissivity variation Δε, unlike the $VO_2$ where the value of the stagnation temperature was only decreased at most by 20° C.;
- the critical transition temperature Tc of the material of the invention with a base of perovskite with a thickness of between 50 and 500 nm is between 80° C. and 120° C. without doping, unlike the $VO_2$, which passes at 68° C.;
- the stability of the multilayer material and its resistance to oxidation are improved; indeed, the layer of perovskite is stable with respect to corrosion, which is not the case for a layer of $VO_2$, which has superoxides such as $V_4O_9$, $V_2O_5$, . . . .

Thus, the multilayer materials of simple design according to the invention due to their thickness and the nature of their thermochrome layer are lasting over time, inoxidizable. They have, even without doping, improved physicochemical properties relative to a material with a base of $VO_2$, which are usable in particular for the design of solar panels.

Furthermore, the thermochrome layer must also satisfy the standards in use in the European Union.

Thus, the multilayer material M of the invention of simpler design than that of the prior art is capable of self-regulating its optical capacities as a function of its internal temperature T, which is why it consists of an adequate material for use as a thermal solar panel.

The invention claimed is:

1. A thermoregulated multilayer material comprising:
a support having
 a transmission coefficient $\Gamma_s$ substantially equal to 0, for rays with a wavelength λ in a range of from 0.25 to 25 μm;
 a reflection coefficient ρs>0.9, for incident rays with wavelength λ of between 7.5 and 10 μm;
a thermoregulated layer having a thickness in a range of from 50 to 500 nm and a base of rare earth perovskite cobaltites or rare earth perovskite nickelates or rare earth manganites, the thermoregulated layer topping one of the surfaces of the support;
wherein the thermoregulated material has:
 for rays with wavelength λ of between 0.25 and 2.5 μm;
  an absorption coefficient αm>0.8; and for incident rays with wavelength λ of between 7.5 and 10 µm; a reflection coefficient $\rho_m$, wherein:
$\rho_m \geq 0.85$, when the temperature T of said multilayer material (M) is ≤100° C.;
$0.3 \leq \rho_m \leq 0.85$, when the temperature T of said multilayer material is in a range of from 100 to 400° C.

2. The thermoregulated multilayer material according to claim 1, wherein the perovskites have formula:

$$ABO_3$$

wherein:
"A" is at least one single chemical element or a group of chemical elements belonging to the rare earths group;
"B" is either cobalt Co, or nickel Ni, or manganese Mn, and
"$O_3$" represents three oxygens.

3. The thermoregulated multilayer material according to claim 2, wherein "A" corresponds to at least one chemical element belonging to the rare earths family and being selected from the group consisting of lanthanum La, praseodymium Pr, neodymium Nd, samarium Sm, gadolinium Gd, and europium Eu.

4. The thermoregulated multilayer material according to claim 3, wherein the at least one chemical element "A" of the perovskite with formula $ABO_3$ is partially doped with at least one chemical element "E" of atomic fraction "z" in a range of from 0.1 to 0.6, the element "E" belonging to the alkaline-earth group and being selected from the group consisting of strontium Sr, calcium Ca, and barium Ba.

5. The thermoregulated multilayer material according claim 3, wherein the element "B" of the perovskite with formula $ABO_3$ is partially doped with at least one chemical element "D" of atomic fraction "y" in a range of from 0.1 to 0.5, the element "D" belonging to the transition metals group and being selected from the group consisting of cobalt Co, nickel Ni, manganese Mn, iron Fe, titanium Ti, vanadium V, and chromium Cr.

6. The thermoregulated multilayer material according to claim 2, wherein the at least one chemical element "A" of the perovskite with formula $ABO_3$ is partially doped with at least one chemical element "E" of atomic fraction "z" in a range of from 0.1 to 0.6, the element "E" belonging to the alkaline-earth group and being selected from the group consisting of strontium Sr, calcium Ca, and barium Ba.

7. The thermoregulated multilayer material according claim 6, wherein the thermoregulated layer having formula ABO3, comprising at least one of these elements "A", "B" or partially doped "$O_3$", has:
a thickness of between 300 and 500 nm, and
for incident rays with wavelength λ in a range of from 7.5 to 10 µm, a transmission coefficient $\Gamma_T$, wherein:
$\Gamma_T \geq 0.95$ for an internal temperature of the thermoregulated layer less than or equal to 100° C.;
$\Gamma_T \leq 0.6$ for an internal temperature of the thermoregulated layer in a range of from 100 to 200° C.

8. The thermoregulated multilayer material according to claim 6, wherein the thermoregulated layer has formula $A_{1-z}E_zCoO_3$ or $A_{1-z}E_zNiO_3$ or $A_{1-z}E_zMnO_3$.

9. The thermoregulated multilayer material according claim 6, wherein the element "B" of the perovskite with formula $ABO_3$ is partially doped with at least one chemical element "D" of atomic fraction "y" in a range of from 0.1 to 0.5, the element "D" belonging to the transition metals group and being selected from the group consisting of cobalt Co, nickel Ni, manganese Mn, iron Fe, titanium Ti, vanadium V, and chromium Cr.

10. The thermoregulated multilayer material according claim 2, wherein the element "B" of the perovskite with formula $ABO_3$ is partially doped with at least one chemical element "D" of atomic fraction "y" in a range of from 0.1 to 0.5, the element "D" belonging to the transition metals group and being selected from the group consisting of cobalt Co, nickel Ni, manganese Mn, iron Fe, titanium Ti, vanadium V, and chromium Cr.

11. The thermoregulated multilayer material according to claim 10, wherein the thermoregulated selective layer has formula $ACo_{1-y}D_yO_3$ or $ANi_{1-y}D_yO_3$ or $AMn_{1-y}D_yO_3$.

12. The thermoregulated multilayer material according to claim 2, wherein the oxygens "$O_3$" of the perovskite with formula $ABO_3$ are partially doped with nitrogen N having atomic fraction "x" in a range of from 0.03 to 1.

13. The thermoregulated multilayer material according to claim 12, wherein the thermoregulated layer has formula $ACoO_{3-x}N_x$ or $ANiO_{3-x}N_x$ or $AMnO_{3-x}N_x$.

14. The thermoregulated multilayer material according to claim 1, wherein the support consists of a metal sheet having a base of aluminum Al or copper Cu.

15. The thermoregulated multilayer material according to claim 1, wherein the thermoregulated layer is covered with an antiglare layer.

16. The thermoregulated multilayer material according to claim 1, further comprising a barrier layer able to prevent the diffusion in solid state of chemical elements of the support toward the thermoregulated layer, the barrier layer being positioned between the support and the thermoregulated layer.

17. The thermoregulated multilayer material according to claim 1, having:
for rays having a wavelength λ in a range of from 0.25 to 2.5 µm, an absorption coefficient $\alpha m \geq 0.94$; and
for incident rays having a wavelength λ in a range of from 7.5 to 10 µm, a reflection coefficient $\rho_m$, wherein:
$\rho_m \geq 0.92$, when the temperature T of the multilayer material is ≤100° C.;
$\rho_m \leq 0.6$, when the temperature of the multilayer material is ≥100° C.

18. A method for manufacturing a thermoregulated multilayer material, comprising:
depositing a thermoregulated layer having general formula $ABO_3$ on a support by vacuum co-sputtering, in the presence of a reactive plasma of argon and oxygen or of pure argon, wherein "A" is at least one single chemical element or a group of chemical elements belonging to the rare earths group and "B" is a transition metal of type Ni, Mn or Co,
annealing the material previously obtained ex situ at temperatures in a range of from 525 to 800° C. for a duration of from 30 seconds to 1 hour,
so as to obtain the thermoregulated multilayer ma al according to claim 1.

19. The method according to claim 18, wherein the material previously obtained is annealed ex situ at temperatures in a range of from 575 and 600° C. for a duration of from 30 seconds to 240 seconds.

20. A solar panel comprising a thermoregulated multilayer material according to claim 1.

* * * * *